(12) United States Patent
Tatsuno

(10) Patent No.: US 6,191,695 B1
(45) Date of Patent: Feb. 20, 2001

(54) GAS STATION WITH ELECTROMAGNETIC-WAVE SENSOR

(75) Inventor: Hiyoshi Tatsuno, Tokyo (JP)

(73) Assignee: Tatsuno Corporation, Tokyo (JP)

( * ) Notice: Under 35 U.S.C. 154(b), the term of this patent shall be extended for 0 days.

(21) Appl. No.: 09/392,479

(22) Filed: Sep. 9, 1999

(30) Foreign Application Priority Data

Jul. 1, 1999 (JP) .................................................. 11-187253

(51) Int. Cl.⁷ .................................................. G08B 17/12
(52) U.S. Cl. .......................................... 340/600; 340/635
(58) Field of Search ..................... 340/600, 635; 324/260

(56) References Cited

U.S. PATENT DOCUMENTS 5,403,205 * 4/1995 Hashiguchi .......................... 439/607

* cited by examiner

*Primary Examiner*—Julie Lieu

(57) ABSTRACT

A gas station is disclosed which contains one or more fueling units; an electromagnetic-wave sensor for detecting electromagnetic waves which are unwanted in fueling operation; and one or more communicators for showing the electromagnetic-wave detection by the electromagnetic-wave sensor, the electromagnetic-wave sensor being provided outside the fueling units.

20 Claims, 8 Drawing Sheets

GAS STATION WITH ELECTROMAGNETIC-WAVE SENSOR

BACKGROUND OF THE INVENTION

1. Field of the Invention

The present invention relates to a gas station with an electromagnetic-wave sensor, more precisely a gas station wherein electromagnetic waves, which are generated by a portable phone or like, are detected by a sensor therefor and the detection is notified to people by the provision of communicators.

2. Discussion of Related Art

Recently, a medium for movable-body-communication, in particular a portable telephone, has rapidly spread. The electromagnetic waves come out of media for such movable-body-communication, especially of portable telephones, however, often cause problems, for instance causing machinery to function improperly.

A weak electric current generates on a portable telephone in the case of the outgoing and incoming communication. In a gas station where fuel runs from a fueling port and fuel vapor remains around fueling units, it is desirable to identify the use of portable telephones so that appropriate safety measures can be taken.

In a gas station hitherto, customers or clerks may use portable telephones by mistake even though notice not to use the telephones has been made, or in some cases, portable telephones which have been left without cutting the power supply receive messages. In known gas stations, it is not possible to completely prevent the generation of unwanted electromagnetic waves.

SUMMARY OF THE INVENTION

It is therefore an object of the present invention to provide a gas station where electromagnetic waves generated by a portable telephone or the like are readily detected, and the detection is signaled.

The above object of the present invention can be achieved by a gas station comprising one or more fueling units; an electromagnetic-wave sensor for detecting electromagnetic waves which are unwanted in fueling operation; and one or more communicators for indicated the electromagnetic-wave detection by the electromagnetic-wave sensor, the electromagnetic-wave sensor being provided outside the fueling units.

The object of the present invention can be achieved also by a gas station comprising one or more fueling units; one or more electromagnetic-wave sensors for detecting electromagnetic waves which are unwanted for fueling operation; and one or more communicators for indicating the electromagnetic-wave detection by the electromagnetic-wave sensor, each of the fueling units containing the electromagnetic-wave sensor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
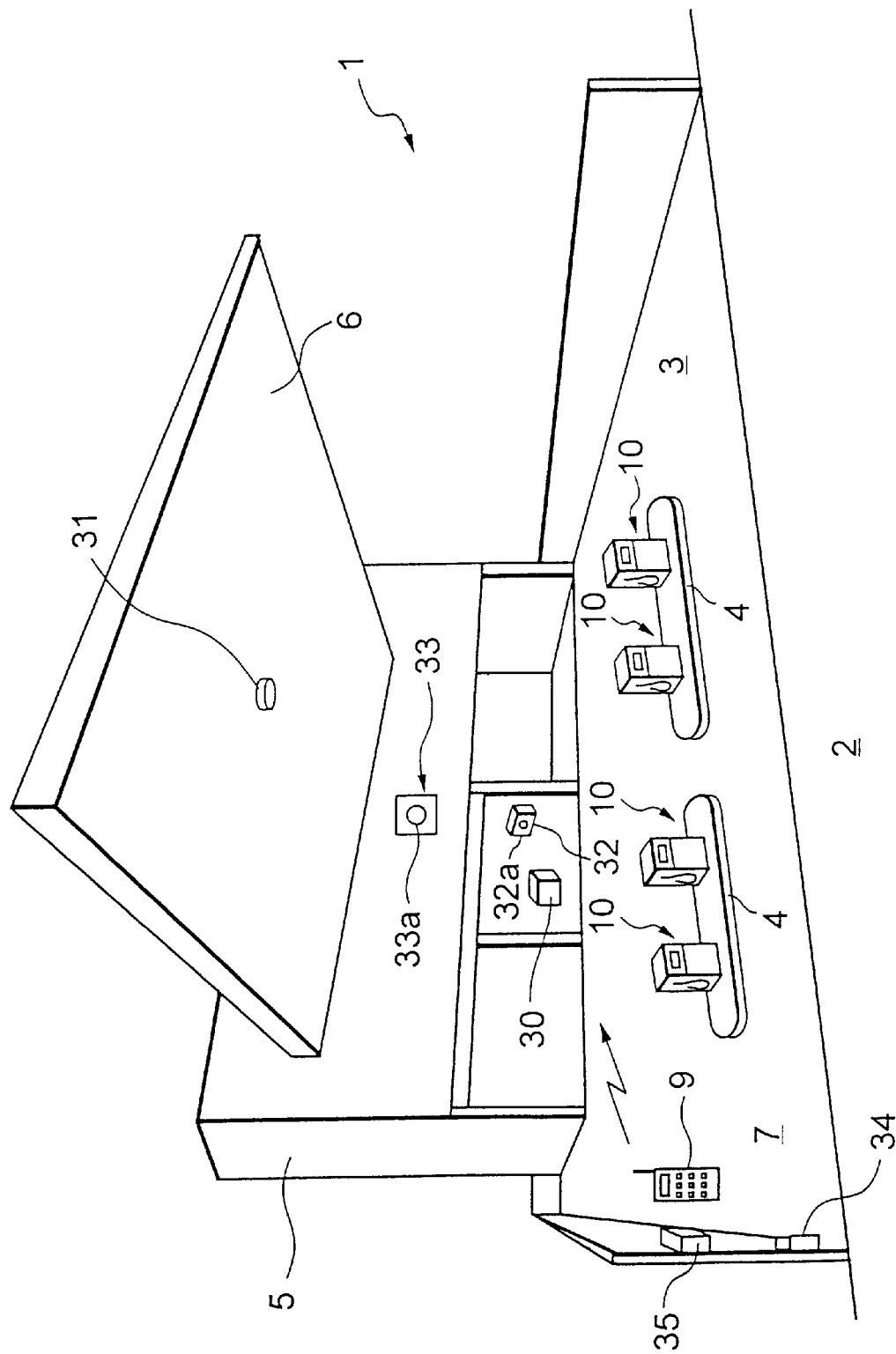
FIG. 1 is a schematic perspective view for explaining the structure of a gas station as a first embodiment according to the present invention.

The gas station of the present invention comprises one or more fueling units; an electromagnetic-wave sensor for detecting electromagnetic waves which are unwanted in fueling operation; and one or more communicators for indicating the electromagnetic-wave detection by the electromagnetic-wave sensor, the electromagnetic-wave sensor being provided outside the fueling units.

The gas station comprising one or more fueling units; one or more electromagnetic-wave sensors for detecting electromagnetic waves which are unwanted in fueling operation, and one or more communicators for showing the electromagnetic-wave detection by the electromagnetic-wave sensor, each of the fueling unit containing the electromagnetic-wave sensor.

The electromagnetic-wave sensor for use in the present invention is provided outside the fueling unit in a location from which unwanted electromagnetic waves (hereinafter, may be referred to as electromagnetic waves) in the gas station are well sensed, preferably at the inner surface of the canopy (roof of the gas station at the center thereof. Alternatively, in the present invention the electromagnetic-wave sensor can be provided in each of the fueling units. In the latter case, it is easy to know around which fueling unit a portable telephone or the like is used.

It is preferable that the gas station of the present invention further comprise a fuel-manage unit. When electromagnetic waves are detected by the electromagnetic-wave sensor in the gas station, the fuel-manage unit transmits a detection signal to the communicators which signals the detection thereon whereby it becomes possible to urge people in the gas station not to use of a portable phone in the gas station and to prevent the fuel vapor generation by suspending the fueling in accordance with the notice by the communicators.

Moreover, the fueling unit of the present invention preferably comprise a control unit in each of the fueling units. The fueling can be suspended by the receipt of a signal from the control units after the detection signal being transmitted thereto via the above-mentioned fuel-manage unit or directly from the electromagnetic-wave sensors provided in each of the fueling units. Thus, the fueling can be suspended.

The communicators for use in the present invention can be provided in the gas station for instance on each of the fueling unit, in an office within the gas station, and outside the office. By the provision of the communicators in this way, people nearby the fueling units can see notice on the fueling units, and people in the office and outside the office are respectively notified by the communicators provided indoors and outdoors. It is possible in the present invention to use communicators which indicate the detection by means of light or sound. Moreover, it is possible to use communicators which make indication thereon by other means, as long as people can easily see the indication.

Other feature of this invention will become apparent in the course of the following description of exemplary embodiments, which are given for illustration of the invention and are not intended to be limiting thereof.

As is illustrated in the form of a perspective view in FIG. 1, a gas station 1 as a first embodiment of the present invention faces a road 2. In the site 3 of gas station 1, there are islands 4 on each of which two fueling units 10 are provided. On the rear part of the site 3, the opposite side to the road 2, an office building 5 is there wherein a fuel-manage unit 30 and an indoor communicator 32 are provided. An outdoor communicator 33 is provided on the outside wall of the office building 5 in such a fashion that the communicator 33 can be seen from almost all parts within the site 3. A canopy 6 covers the site 3 extending from the front upper surface of the building 5 to the part above the fueling units 10. An electromagnetic-wave sensor 31 is provided on the canopy 6 on the lower surface thereof, for detecting electromagnetic waves generated from a portable telephone 9 employed in the site 3. The sensor 31 detects, for instance, electromagnetic waves with a predetermined frequency generated from the portable phone 9 located in the range of about 10 meters therefrom. Nearby an entrance 7 for a car, there are also provided an entrance sensor 34 for detecting the entrance of a car to the site 3, and an information machine 35 from which audible signals are output based upon the detection signal from the entrance sensor 34, for giving notice not to use a portable phone within the site 3.

Figure 2:
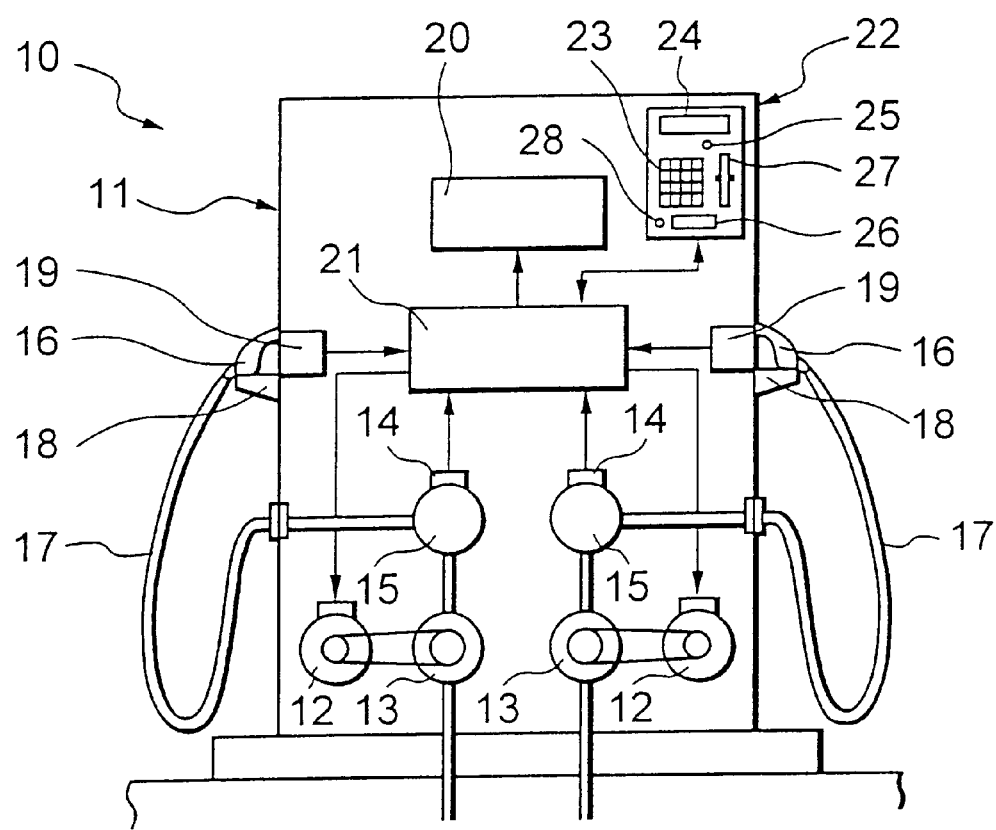
FIG. 2 is a schematic diagram for showing the structure of a fueling unit to be installed in the gas station as the first embodiment of the present invention.

FIG. 2 shows a schematic diagram of the fueling unit 10 to be used in the gas station as the first embodiment of the present invention. The fueling unit 10 supplies, for example, two kinds of fuels. A casing 11 contains fueling pumps 13 which can be driven by means of pump-drive-motors 12, and flow-meters 15 with flow-volume-pulse generator 14 thereon, being successively connected on fueling pipes to the underground tanks. Furthermore, pipes connected to the outlets of the flow meters 15 are led to the outside of the casing 11, connected to fueling hoses 17 with fueling nozzles 16 at the free ends thereof. Nozzle rests 18 for hanging the fueling nozzles 16 thereon are provided on the casing 11, with nozzle switches 19 being arranged nearby the nozzle rests 18.

Moreover, a control unit 21 is provided in the casing 11, which controls the movement of the pump-drive-motors 12 in response to signals from nozzle switches 19 and a fuel-manage unit (to be explained below in detail), the control unit 21 also controlling the indication onto a display 20 of the fueled volume by calculating the flow volume of fuel by integrating pulses output from the flow-volume-pulse generator 14.

There is provided an operation panel 22 on the front surface of the casing 11. The operation panel 22 contains thereon a keyboard 23 for selecting the fuel sort and fueling volume; a panel indicator 24 for indicating the data input from the keyboard 23 and information obtained from the fuel-manage unit via the control unit 21; a panel communicator 25 for indicating information from the fuel-manage unit via the control unit 21 or from the control unit 25 itself a printer 26 for issuing a fueling bill; a card reader 27; and a re-fuel switch 28 for starting fueling again after the suspension of fueling.

Figure 3:
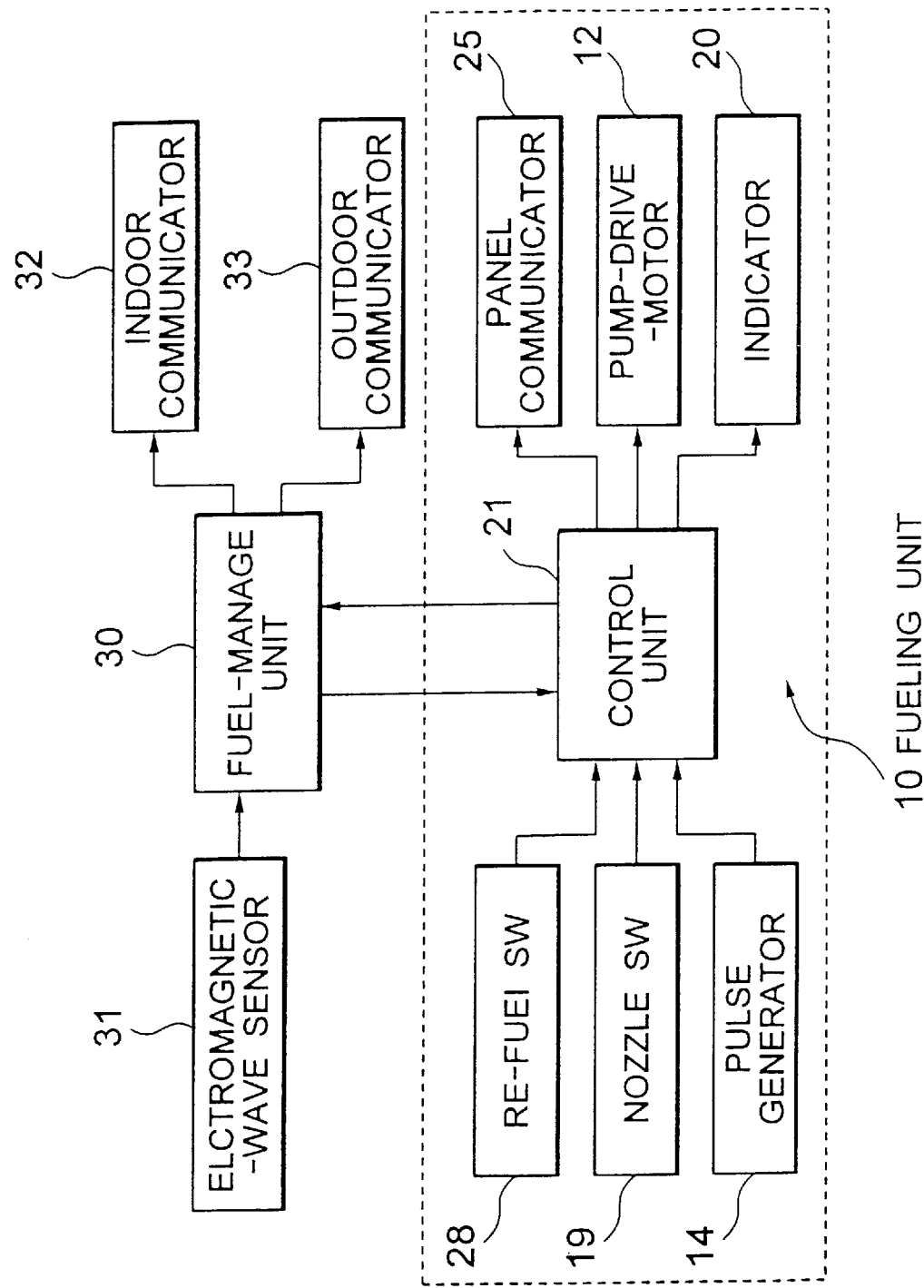
FIG. 3 is a block diagram for explaining the structure of the gas station as the first embodiment according to the present invention.

With referring to FIG. 3, signal transmission in the fuel system for use in the present invention will now be explained.

The control unit 21 and the fuel-manage unit 30 are connected to each other for the signal transmission therebetween. The control unit 21 contained in the fueling unit 10 transmits a signal relating to fuel volume or the like to the fuel-manage unit 30. On the other hand, the fuel-manage unit 30 outputs a signal for controlling the fueling unit 10 to the control unit 21.

The fuel-manage unit 30 for use in the present invention is a unit for receiving signals from the fueling units 10, transferring the signals to POS terminal (not shown) or the like, and transmitting signals detected by the electromagnetic-wave sensor 31 to the pump-drive-motors 12 to make the pumps to stop and drive again. The fuel-manage unit 30 also outputs signals for controlling the indoor and outdoor communicators 32 and 33.

The control unit 21 further receives signals from the re-fuel switch 28, nozzle switch 19, and flow-volume-pulse generator 14, and outputs signals to the panel communicator 25, pump-drive-motors 12, and the indicator 20.

Referring back to FIG. 1, the indoor communicator 32 installed in the office building 5 notices information to people therein, the indoor communicator 32 being provided with a portable-telephone-use-state communicator 32a on the front surface thereof. The communicator can be designed as a device showing indication by light or sound.

The outdoor communicator 33 is provided on the outer wall of the building 5 at a front upper part as can be seen from customers and clerks in the site 3. The outdoor communicator 33 has a portable-telephone-use-state communicator 33a, which makes communication by means of light or sound, on the front surface thereof.

In this first embodiment of the present invention, the information machine 35 outputs message not to use a portable telephone to customers when the entrance sensor 34 detects an automobile entering to the gas station through the entrance 7 as mentioned previously. Accordingly, the customers recognizes beforehand that the use of portable telephones are prohibited within the site 3 of the gas station.

In the case, for instance, where a customer could not catch the message from the information machine 35, the customer may use a portable telephone 9. The electromagnetic-wave sensor 31 is employed in the present invention for detecting the electromagnetic waves generated from the portable telephone 9 (or from any other device which generates undesired electromagnetic waves). As explained in the flowchart in FIG. 4 for showing the function of the fuel-manage unit 30 for use in the present invention when the electromagnetic-wave sensor 31 detects electromagnetic waves generated from a portable telephone 9 (ST 1), the fuel-manage unit 30 transmits a detection signal to the outdoor and indoor communicators 32 and 33, simultaneously transmitting the detection signal to each of the fueling units 10 (ST 2), to make indication on the panel communicator 25 and panel indicator 24 provided on each of the fueling units 10. The communicating state is maintained while the electromagnetic waves are being detected by the electromagnetic-wave sensor 31. When the electromagnetic waves are not detected any more (ST 3), the fuel-manage unit 30 outputs a signal to stop the communication made by the indoor and outdoor communicators 32 and 33, transmitting a non-detection signal to the fuel units 10 (ST 4), whereby the indication by the panel communicator 25 and panel indicator 24 on each of the fueling unit 10 are canceled.

Figure 5:
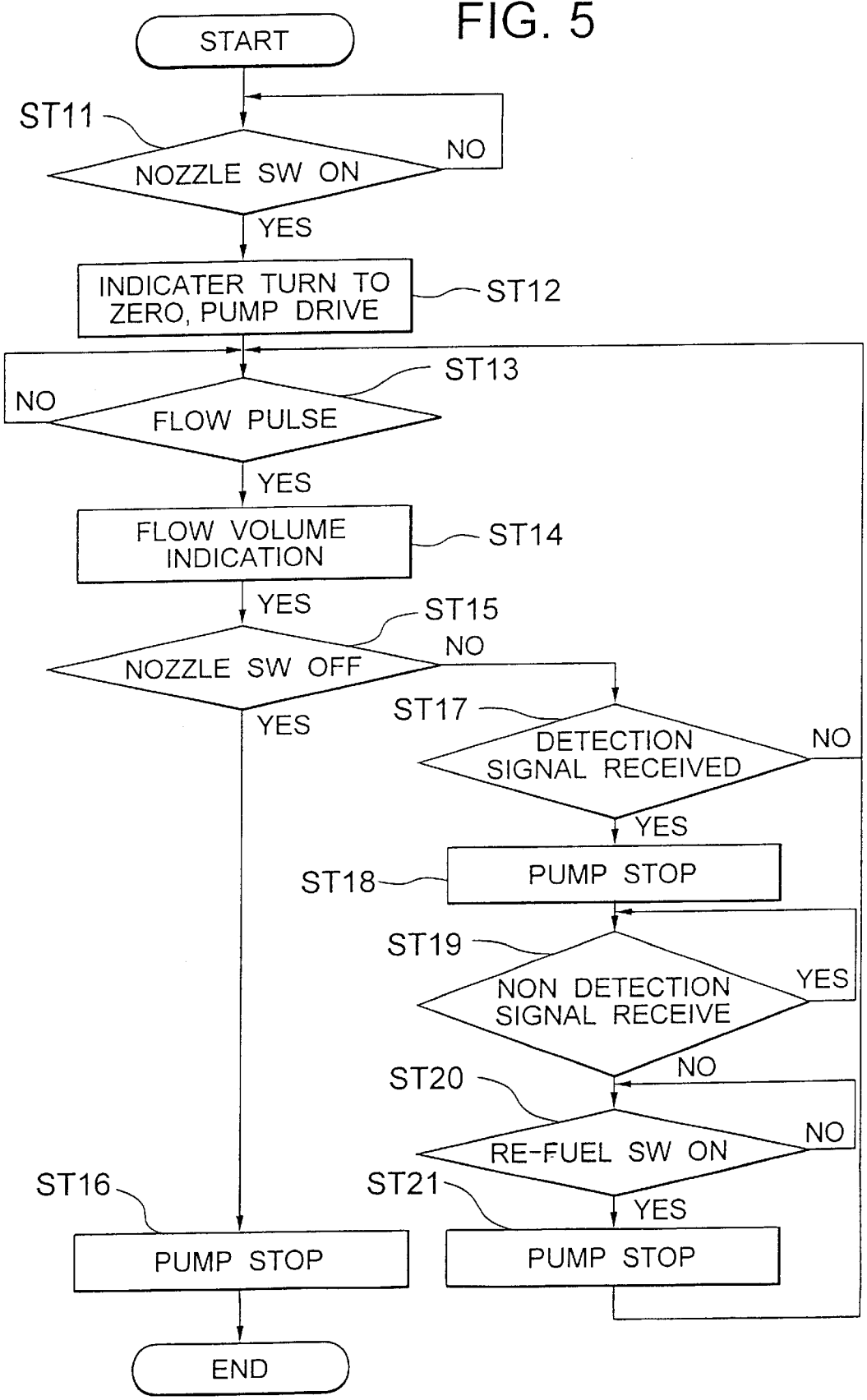
FIG. 5 is a flow-chart for explaining the movement of the fueling unit for use in the gas station as a first embodiment according to the present invention.

FIG. 5 shows a flow-chart for explaining the function of the fueling units 10 for use in the present invention.

When a fueling nozzle 16 is detached from the nozzle rest 18 and the nozzle switch 19 is turned on (ST 11), the control unit 21 brings the indicator 20 back to zero, and causes the pump-drive-motor 12 to be driven (ST 12). Subsequently, when the fuel lever is pulled up upon the fueling nozzle 16 inserted to the fueling tank-port of a car, fuel oil runs into the tank through the fueling pump 13, a flow-volume-pulse signal is output from the flow-volume-pulse generator 14 (ST 13) and the fueled volume is indicated on the indicator 20 after the flow-volume pulse is integrated (ST 14). With the completion of fueling, the nozzle switch 19 is turned off (ST 15), and then the pump-drive-motor 12 is caused to stop driving and the fueling pump 13 is stopped (ST 16).

In the case where a detection signal from the electromagnetic-wave sensor 31 is received by the fuel-manage unit 30 (ST 17), the control unit 21 causes the pump-drive-motors 12 to stop and hence the pumps (ST 18). The suspension state of the pump-drive-motors 12 is maintained as long as the detection signal is being obtained from the fuel-manage unit 30 as the result of the detection by the electromagnetic-wave sensor 31. On the other hand, when the non-detection signal is output by the fuel-manage unit 30, the electromagnetic-wave sensor 31 does not receive the electromagnetic waves any more (ST 19) and the re-fuel switch 28 is turned on (ST 20), the pump-drive-motor 12 is started to be driven again (ST 21). Thus, the system comes back to the step 13 where the flow-volume pulse is counted.

In the gas station with the above-mentioned structure, it is possible to urge people therein to stop the use of a portable phone 9, since the voice machine 35 gives customers messages not to use portable phones 9 as precisely described. However, in a case where a customer uses a portable phone 9 within the site 3, the electromagnetic-wave sensor 31 provided for instance on the lower surface of the canopy 6 and communicators 32 and 33 work and clerks and customers inside or outside the office building 5 could know the caution, whereby fueling can be suspended.

Referring to FIGS. 6 to 9, the second embodiment of the gas station according to the present invention is explained.

Figure 6:
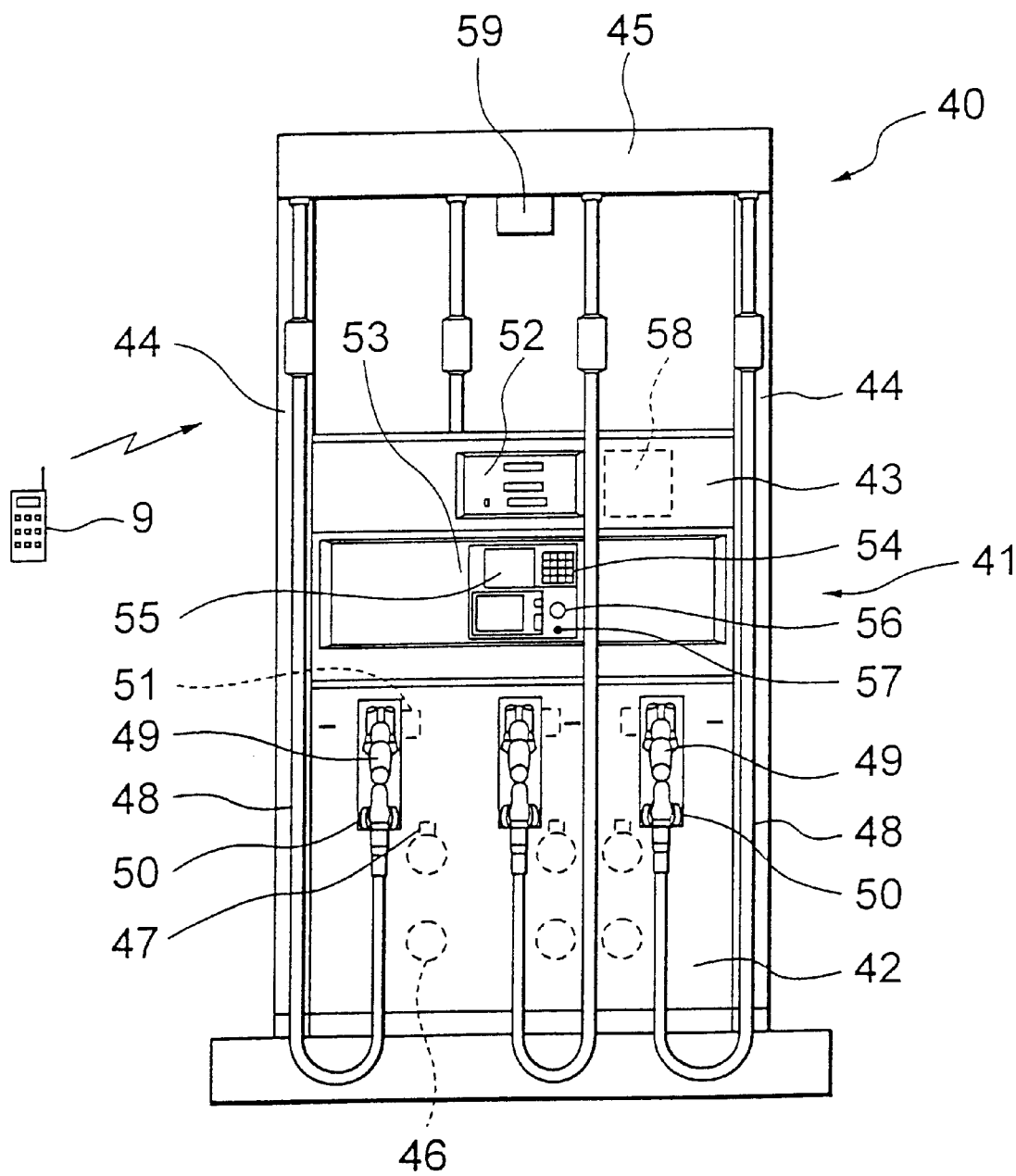
FIG. 6 is a front view of a fueling unit to be installed in a gas station as a second embodiment of the present invention.

In the second embodiment of the present invention a plurality of fueling units 40 as shown by the front view of FIG. 6 are installed in the gas station in the same way as in the perspective view in FIG. 1.

The fueling unit 40 dispenses fuels such as premium, regular, and diesel, of which casing 41 is composed of a main-body casing 42, an indictor casing 43 placed thereon, and a top part casing 45 over the indication casing 43 supported by posts 44. The fueling unit 40 is constructed substantially in the same way as in FIG. 1.

As shown in FIG. 6, there are provided in the fueling unit 40, pump-drive-motors 46 for driving pumps (not shown), and flow meters each provided with flow-volume-pulse generators 47. To the piping provided on the top part casing 45, fueling hoses 48 are connected each at one end thereof and are suspended. The fueling hoses 48 have fueling nozzles 49 at the free ends thereof which can be hung on nozzle rests 50 provided on the main-body casing 42 at the front and back sides thereof. Nozzle switches 51 are formed near by nozzle rests 50. There are also provided indicators 52 for indicating the fueled volume, on the front and back surfaces of the indication casing 43. An operation panel 53 is provided below the indicator 52. The operation panel 53 comprises a keyboard 54 for adjusting fuel types and volume; a panel indicator 55 for indicating the input data from the keyboard 54 and information obtained as a signal from a fuel-manage unit (not shown); a panel communicator 56 from which notice is made as light or sound; and a re-fuel switch 57 which is to be pressed when it becomes necessary to start fueling again after the suspension of fueling.

In this embodiment, signal transmission is performed by way of a control unit 58 contained in the indication casing 43. Moreover, an electromagnetic-wave sensor 59 for detecting electromagnetic waves generated from a portable telephone 9 or the like is adjusted on the top casing 45 at the lower surface thereof.

Figure 7:
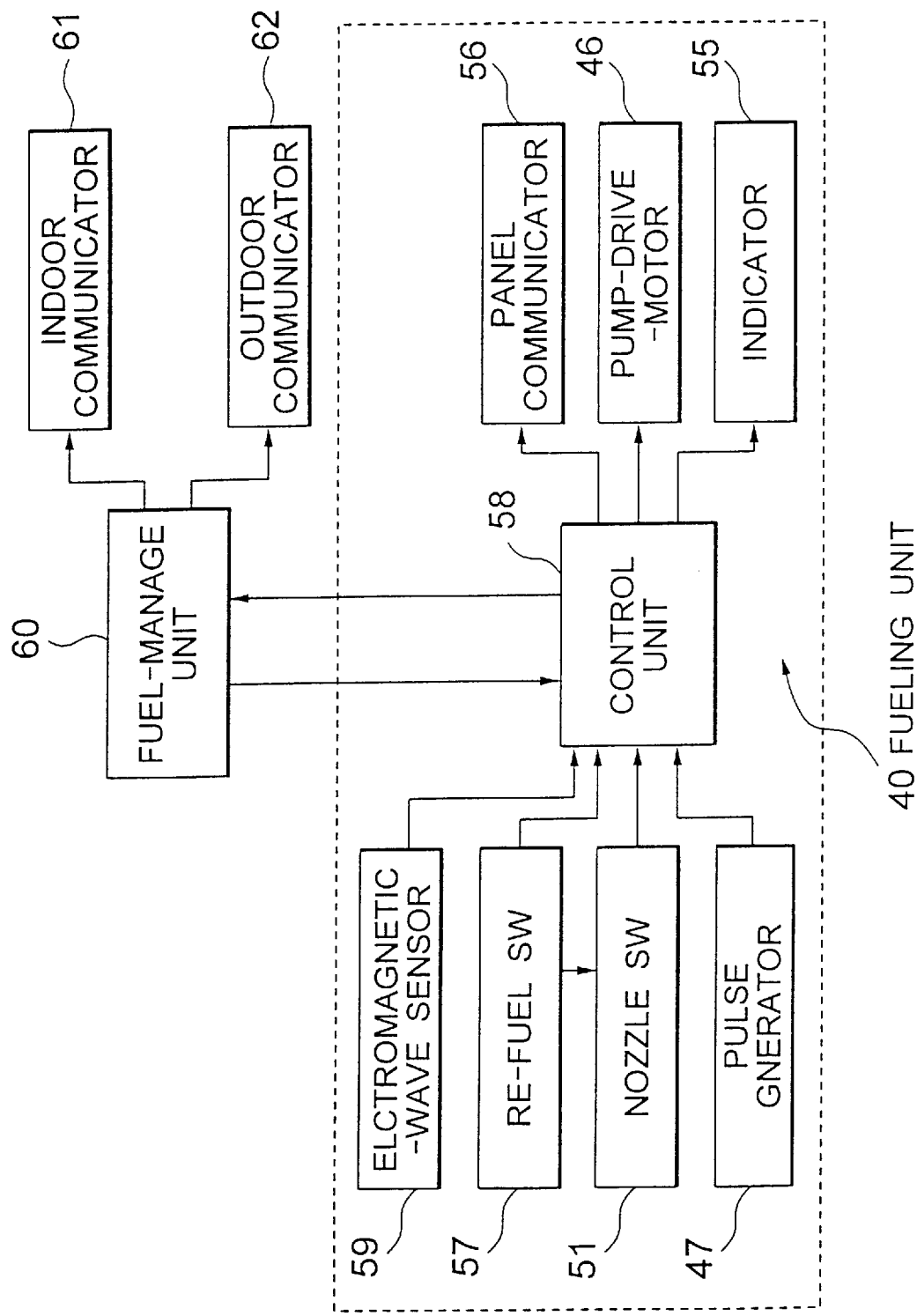
FIG. 7 is a block diagram for explaining the structure of the gas station as the second embodiment according to the present invention.

The signal transmission in the fueling unit 40 is explained with reference to a block diagram shown in FIG. 7.

The signal detected by the electromagnetic-wave sensor 59 in the fueling unit 40 is transferred to the control unit 58. The control unit 58 which has received the detection signal can stop the pump-dive-motors 46 working and causes the panel communicator 56 and panel indicator 55 to give indication. Furthermore, the control unit 58 receives signals from the re-fuel switch 57, nozzle switches 51, and flow-volume-pulse generators 47, and turns on and off the pump-drive-motors 46.

The control unit 58 is connected to a fuel-manage unit 60 which is provided in an office building also in the second embodiment as explained in the first embodiment, and the signal transmission is carried out therebetween. The fuel-manage unit 60 transmits signals to an indoor communicator 61 and an outdoor communicator 62. Namely, the fuel-manage unit 60, which has received a detection signal from the electromagnetic-wave sensor 59 provided in the fueling unit 40, causes the indoor communicator 61 and outdoor communicator 62 to function.

Figure 8:
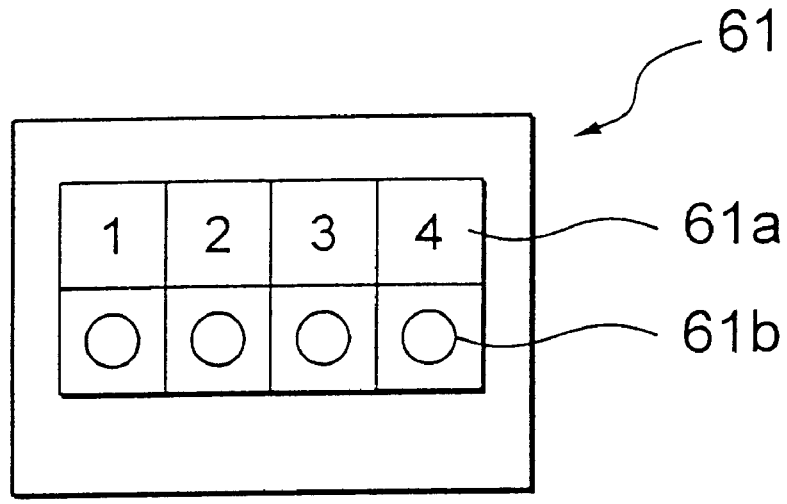
FIG. 8 is a front view of an indoor communicator for use in the gas station as the second embodiment of the present invention.

FIG. 8 is a view for showing the indoor communicator 61 as an example, seen from the front. On the surface of the indoor communicator 61, there are provided an fueling-unit-identification panel 61a and a portable-telephone-use-state indicator 61b which indicate the use of a portable phone by means of light or sound.

Figure 9:
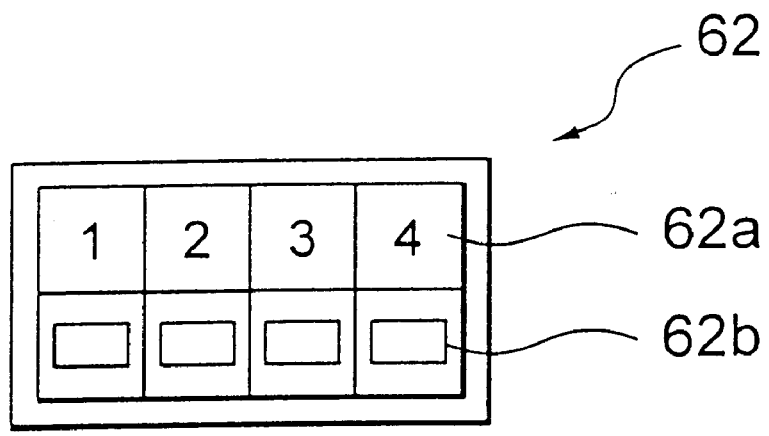
FIG. 9 is a front view of an outdoor communicator for use in the gas station as the second embodiment of the present invention.

FIG. 9 shows the outdoor communicator 62, as a diagram seen from the front, as an example. The outdoor communicator 62 also comprises an fueling-unit-identification panel 62a on which numbers corresponding to the fuel units 40 are shown and a portable-telephone-use-state indicator 62b by which the use of a portable phone is indicated by means of light or sound.

Figure 4:
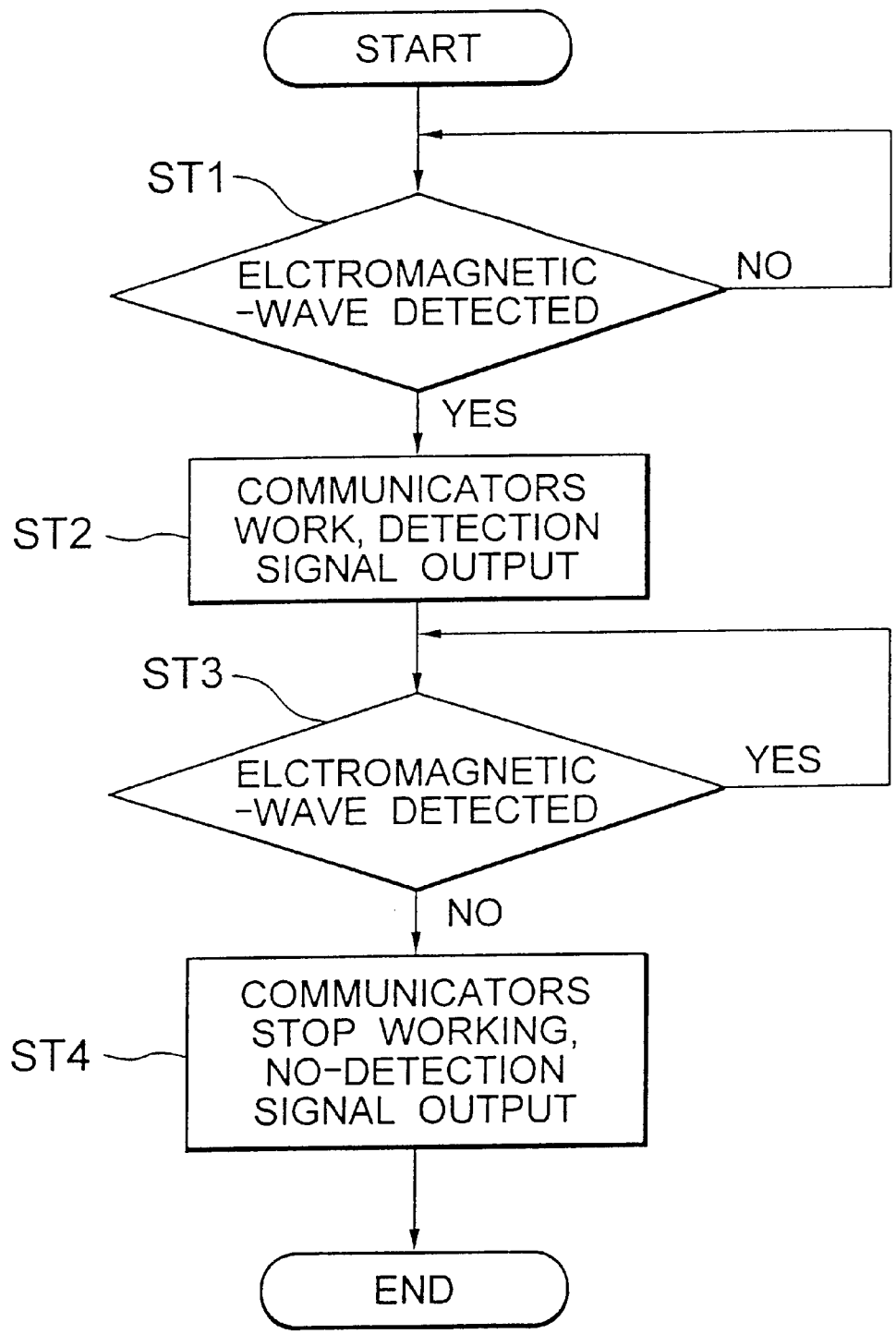
FIG. 4 is a flow-chart for explaining the movement of a fuel-manage unit for use in the gas station as the first embodiment of the present invention.

In the gas station described as the above-mentioned second embodiment according to the present invention, the signal transmission is performed essentially in the same way as in the first embodiment explained with referring to FIGS. 4 and 5.

In the second embodiment, however, the electromagnetic-wave sensor 59 is provided in each of the fueling units 40. When the electromagnetic-wave sensor 59 detects electromagnetic waves from a portable telephone or the like which may act in an undesirable way in the gas station the control unit 58 directly controls the pump-drive-motor 46 to suspend the fueling, cause the panel communicator 56 and panel indicator 55 to show the detection, and transmits the detection signal to the fuel-manage unit 60 provided in the office building. The fuel-manage unit 60 controls the indoor and outdoor communicators 61 and 62, respectively on which the portable-telephone-use-state indicators 61*b* and 62*b* work.

Moreover, when the electromagnetic-wave sensor 59 no longer detects electromagnetic waves, the signals shown by the panel communicator 56 and the panel indicator 55 are canceled. And then, fueling is started again when the refuel switch 57 is turned on. In this case, the fuel-manage unit 60 outputs a signal for turning off the indoor and outdoor communicators 61 and 62 upon the receipt of the non-detection signal transmitted from the control unit 58.

Accordingly, it is possible to suspend fueling and to eliminate the generation of fuel vapor when a portable telephone 9 is used nearby the fueling unit 40.

Furthermore, according to the present invention, people in the gas station are notified that undesired electromagnetic waves are generated, by the provision of the panel communicator 56 or the panel indicator 55 nearby the operation panel 53 of the fueling unit 40. Moreover, the clerks in the office or outside the office can readily recognize which electromagnetic-wave sensor 59 in which fueling unit 40 has detected magnetic waves generated, for instance, by the use of a portable telephone 9 since the indoor and outdoor communicators 61 and 62 identify the fueling unit 40. Thus, the clerk can advise the telephone user not to use the phone.

In the above two embodiments, it is also possible not to stop fueling when electromagnetic signal is detected, only showing indication by the communicators. In the present invention, it is also possible to use other different types of fueling units which can dispense several types of fuel.

The description is made in the above embodiments with respect to electromagnetic waves generated from a portable phone. However, the electromagnetic waves which are detected by the electromagnetic-wave sensors 31, 59 for use in the present invention are not always generated from a portable phone. Moreover, it is possible to provide a system wherein the electromagnetic-wave signal detected by the electromagnetic-wave sensor 31 which is placed outside the fueling unit 10 is directly transmitted to the control unit 21 in the fueling unit.

As mentioned previously, the indoor communicators 32 and 61, the outdoor communicators 33 and 62 can shows the detection by light-on, light-on-and-off, a sound of buzzer or the like. The panel communicators 25 and 56 also can be designed as outputting light or sound by which the detection signal is notified to people there. It is a matter of course that the indication on the panel displays 24 and 55 can be made by use of letters, characters, pictures or the like. Here, the fueling unit for use in the present invention may only have either one of the panel communicator or panel display.

As is obvious from the above explanation, the gas station according to the present invention comprises one or more electromagnetic-wave sensors and communicators, thereby providing safe operating conditions.

What is claimed is:

1. A gas station comprising:
   at least one fueling unit;
   an electromagnetic-wave sensor for detecting electromagnetic waves which are unwanted in fueling operation; and
   at least one communicator for indicating electromagnetic-wave detection by said electromagnetic wave sensor being provided outside said fueling units; and
   means for controlling fuel dispensing in response to the detection of the magnetic waves.

2. The gas station as claimed in claim 1, further comprising a fuel-manage unit located outside said fueling unit, wherein the detection of the electromagnetic-waves by said electromagnetic-wave sensor is shown on said communicators through said fuel-manage unit.

3. The gas station as claimed in claim 2, wherein each fueling unit comprises a control unit therein, and wherein a detection signal generated when the electromagnetic waves are detected by said electromagnetic-wave sensor is transmitted to said control unit via said fuel-manage unit.

4. The gas station as claimed in claim 3, wherein said control unit can suspend fueling.

5. The gas station as claimed in claim 1, wherein said electromagnetic-wave sensor is provided on a canopy over the gas station, wherein said electromagnetic-wave sensor is provided on a lower surface of said canopy.

6. The gas station as claimed in claim 1, wherein the electromagnetic-wave sensor detects electromagnetic waves that are generated from a portable telephone used in the gas station.

7. The gas station as claimed in claim 1, wherein more than one of said at least one communicator is used in said gas station, and said communicators are a panel communicator provided on said fueling unit, an indoor communicator provided in an office within said gas station, and an outdoor communicator provided outside the office.

8. The gas station as claimed in claim 1, wherein the at least one communicator outputs signals by means of light, sound or both light and sound.

9. A gas station comprising:
   at least one fueling unit;
   an electromagnetic-wave sensor for detecting electromagnetic waves which are unwanted in fueling operation; and
   at least one communicator for indicating electromagnetic-wave detection by said electromagnetic wave sensor, each fueling unit containing said electromagnetic-wave sensor; and
   means for controlling fuel dispensing in response to the detection of the magnetic waves.

10. The gas station as claimed in claim 9, wherein each fueling unit comprises a control unit therein, and a detection signal generated when the electromagnetic waves are detected by said electromagnetic-wave sensor is directly transmitted to said control unit, and said control unit causes said communicators to show the detection of the electromagnetic waves.

11. The gas station as claimed in claim 10, further comprising a fuel-manage unit outside said fueling units, said fuel-manage unit cause two of said communicators, which are provided independently of said fueling units to show the detection of the electromagnetic waves.

12. The gas station as claimed in claim 9, wherein said control unit can suspend fueling.

13. The gas station as claimed in claim 9, wherein the electromagnetic-wave sensor detects electromagnetic waves that are generated from a portable telephone used in the gas station.

14. The gas station as claimed in claim 9, wherein more than one of said at least one communicator is used in said gas station, and said communicators are a panel communicator provided on said fueling unit, an indoor communicator provided in an office within said gas station, and an outdoor communicator provided outside the office.

15. The gas station as claimed in claim 1, wherein the at least one communicator outputs signals by means of light, sound or both light and sound.

16. A gas station comprising:

at least one fueling unit; wherein each fueling unit comprises a control unit;

an electromagnetic-wave sensor for detecting electromagnetic waves which are unwanted in fueling operation; wherein the electromagnetic waves are generated from a portable telephone;

at least one communicator for indicating electromagnetic-wave detection by said electromagnetic wave sensor being provided outside each fueling unit; and, a fuel-manage unit located outside each fueling unit; and wherein the fuel managing unit controls the fuel dispensing in response to the detection of the magnetic waves.

17. The gas station as claimed in claim 16, wherein the control unit can suspend fueling.

18. The gas station as claimed in claim 17, wherein more than one of said communicator is used in said gas station, and said communicators are a panel communicator provided on each fueling unit, an indoor communicator provided in an office within said gas station, and an outdoor communicator provided outside the office.

19. The gas station as claimed in claim 18, wherein said communicators output signals by means of light, sound or both light and sound.

20. The gas station as claimed in claim 19, wherein the electromagnetic-wave sensor is provided on a canopy over the gas station, wherein said electromagnetic-wave sensor is provided on a lower surface of said canopy.

* * * * *